United States Patent [19]

Rouault et al.

[11] Patent Number: 4,849,367

[45] Date of Patent: Jul. 18, 1989

[54] METHOD OF MANUFACTURING A DMOS

[75] Inventors: Gwenael Rouault, Tours; Hervé Guerner, Nantes, both of France

[73] Assignee: Thomson Semiconducteurs, Paris, France

[21] Appl. No.: 111,616

[22] Filed: Oct. 23, 1987

[30] Foreign Application Priority Data

Oct. 24, 1986 [FR] France ................. 86 14832

[51] Int. Cl.⁴ .......................................... H01L 21/316
[52] U.S. Cl. ........................................ 437/41; 437/38;
437/968; 437/985; 437/978; 437/153;
148/DIG. 106
[58] Field of Search ................... 437/38, 41, 968, 985,
437/42, 43, 44, 45, 978, 153; 357/23.4;
148/DIG. 106

[56] References Cited

U.S. PATENT DOCUMENTS

| | | | |
|---|---|---|---|
| 4,271,583 | 6/1981 | Kauhng et al. | 437/978 |
| 4,417,385 | 11/1983 | Temple | 437/29 |
| 4,443,931 | 4/1984 | Baliga et al. | 437/152 |
| 4,466,176 | 8/1984 | Temple | 437/27 |
| 4,516,143 | 5/1985 | Love | 357/23 X |

FOREIGN PATENT DOCUMENTS 0097866 11/1984 European Pat. Off. .
2475293 8/1981 France .

Primary Examiner—Brian E. Hearn
Assistant Examiner—T. N. Quach
Attorney, Agent, or Firm—Oblon, Spivak, McClelland, Maier & Neustadt

[57] ABSTRACT

A method of manufacturing a DMOS is disclosed. On a polysilicon gate layer, a multiple dielectric mask including studs (71) defines a window (70) for body implantation (80) into a substrate. Unmasked regions of polysilicon and substrate are oxidized to form oxide regions (84,85,88). Subsequent to the removal of the protective studs and a portion of the oxide, remaining oxide regions (90,91,92) act as a mask for source implantation (99,100).

2 Claims, 3 Drawing Sheets

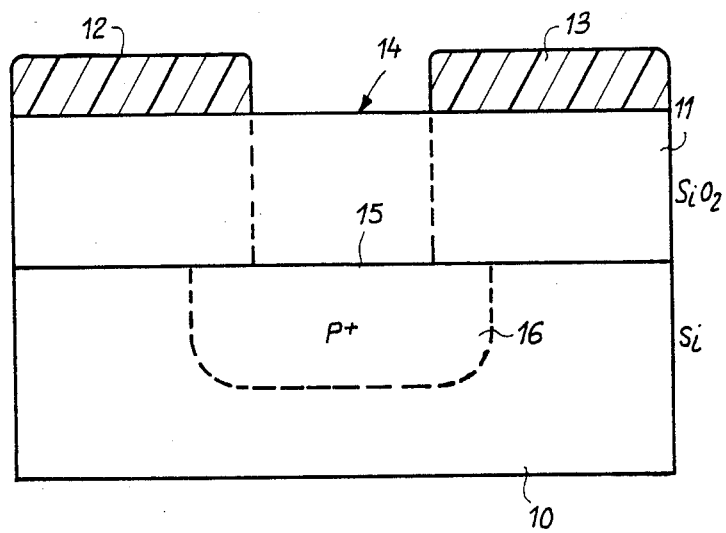
FIG_1
PRIOR ART
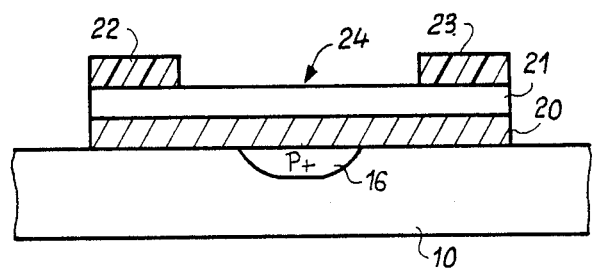
FIG_2
PRIOR ART
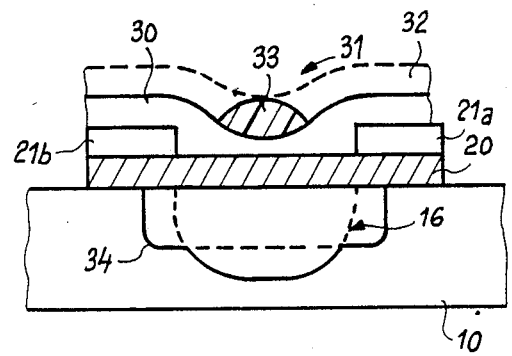
FIG_3
PRIOR ART
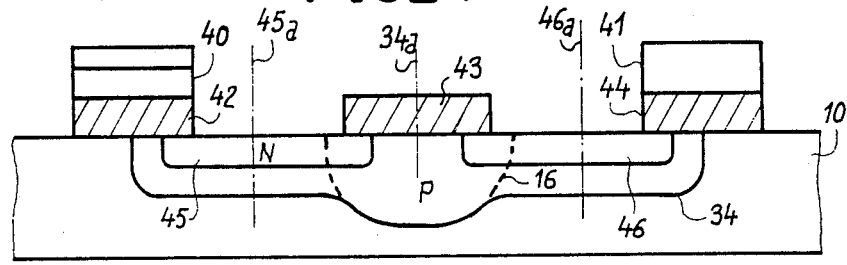
FIG_4 PRIOR ART

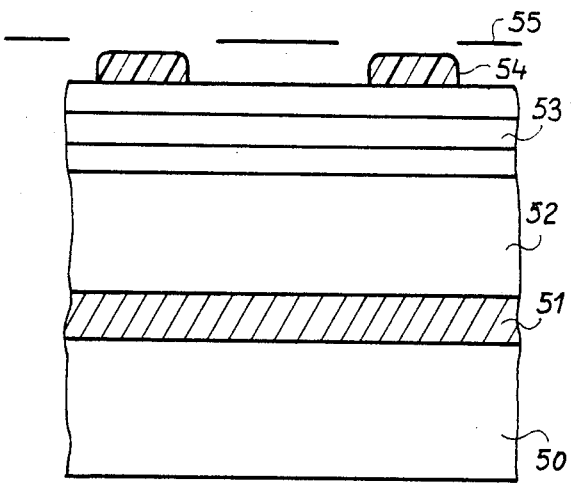
FIG_5
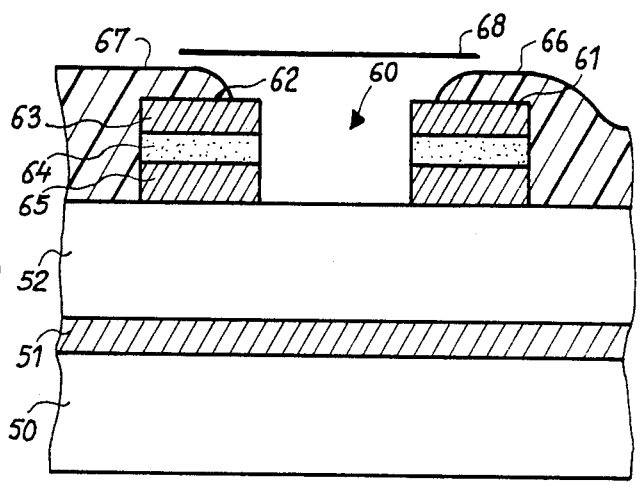
FIG_6
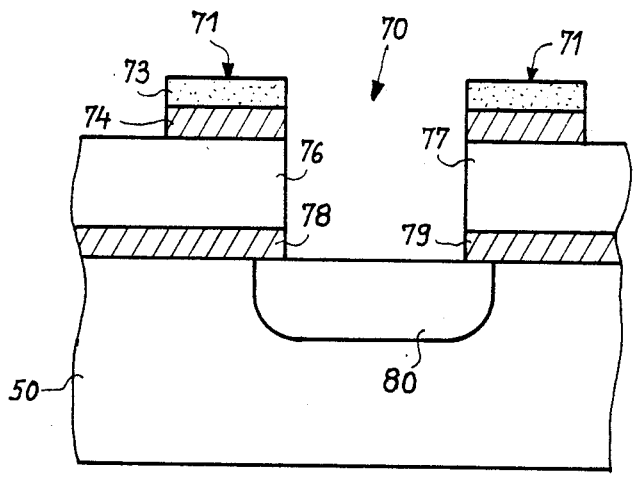
FIG_7

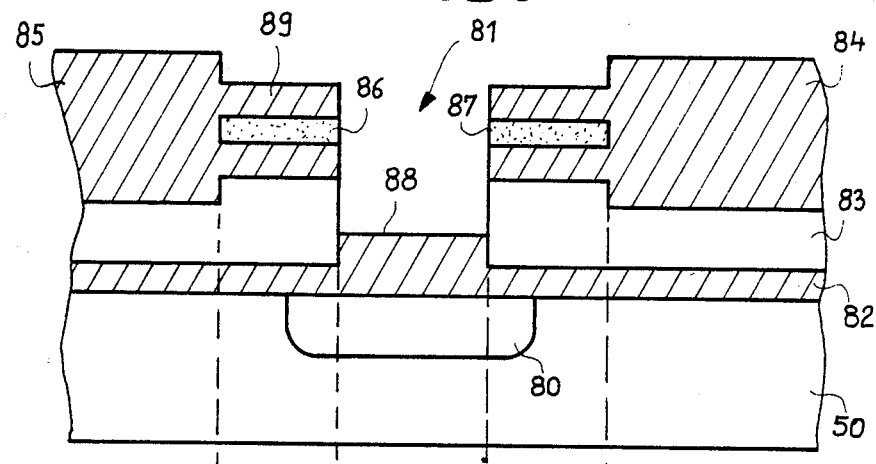
FIG_8
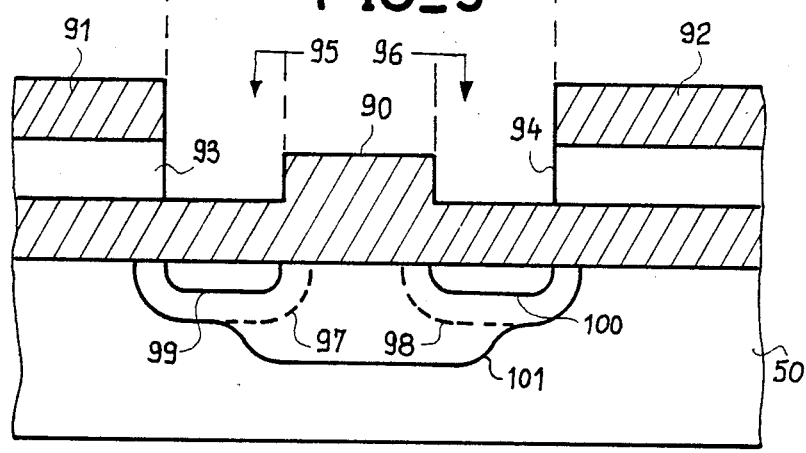
FIG_9

METHOD OF MANUFACTURING A DMOS

BACKGROUND OF THE INVENTION

Field of the Invention

The invention relates to a method for manufacturing, by self alignment, the doped zones of an MOS component. It finds its application in the manufacture of MOS and BIPMOS products, also called IGT, COMFET, GEMFET, with polycrystalline silicon gate designated under the name of polysilicon. It applies more particularly to manufacture using the VD MOS (Vertical metal oxide semiconductor) technology.

A DMOS type component is formed by cells or strips where the source contacts are taken and by gate zones formed of oxide and polysilicon. In the cells, it is necessary to introduce impurities:
  of type P which will determine the parameters of the channel,
  N+, which will determine the source parameters,
  P+: which will contribute to obtaining good characteristics of: ohmic contact with the aluminum connection,
    voltage resistance,
    resistance Rb of the parasite lateral NPN transistor.

The N+ and P+ impurities are limited by the polysilicon. It is the different anealing operations which determine the length and doping of the channel. These two parameters are thus the same for all the cells which form the MOS.

DESCRIPTION OF THE PRIOR ART

In the prior art, the openings corresponding to the polysilicon and to the P+ and N+ diffusion are made separately. The major drawback of this method is that the P+ zone is not systematically centered with respect to the opening in the polysilicon. The problem also occurs for the zone when no N+ impurity is diffused.

SUMMARY OF THE INVENTION

The invention provides a solution for the drawbacks of the prior art, particularly for centering the doping zones and suppressing the centering defects thereof.
It consists:
  in forming two protecting studs on each side of a first zone to be doped,
  in carrying out doping of a first type with high concentration in the first zone to be doped,
  in oxidizing the assembly so that the protecting studs are much less oxidized than the rest,
  in cleaning this oxide as well as the studs defining the window whose relative heights are such that the studs disappear completely during the procedure,
  in carrying out doping of a second type of the silicon at the level of the two openings released by disappearance of the studs.

In FIG. 1 a step has been shown of the conventional manufacturing method of the prior art. On a silicon wafer 10 there is formed a first surface oxidization 11, resin deposits 12, 13 which form a first window 14 for carrying out a first doping. A number 1 exposure mask allows window 14 to be freed. The window is freed of oxide so as to reach the surface 15 of the silicon 10. The following operations are carried out:
  1—washing
  2—implantation (the oxide forms a screen)
  3—annealing To finish the operation, the rest of the oxide is removed.

In FIG. 2 the succession of operations of the conventional method has been shown. At the outset it does not raise particular problems. The silicon is oxidized so as to create a first $SiO_2$ layer 20 which forms the oxide of the MOS transistor. Then a polysilicon layer 21 is deposited and a resin layer 22, 23 is placed. Then a second mask is disposed so as to expose a second window, centered on the first one 14, which is wider than this latter. The centering is particularly important with respect to the future quality of the product. A window 24 is formed by exposure, then the polysilicon layer 21 is plasma etched.

In FIG. 3, the window thus formed is limited by two plates 21a and 21b of polysilicon 21. A P type implantation is carried out in silicon 10 through the oxide layer 20. The polysilicon plate 21a and 21b form a screen for this implantation. Then the doped zone 16 is widened by implantation on each side of zone 16 following a profile 34. The oxidation or oxide deposition is then carried out. Then a new resin layer 32 is deposited on the assembly, and yet a new mask is applied so as to form only a zone 33 protected by the resin after exposure. Centering of this third mask is a further source of error. Then the oxide layer is etched and the resin washed away.

In FIG. 4, the component is finished after the double implantation 45 and 46 are placed on each side of the oxide stud 43 safeguarded from exposure by the resin 33 of FIG. 3, and annealing of the component. It is then sufficient to prepare the connections.

There arises a great problem of accuracy, if it is desired to guarantee the performances of a component, in positioning the masks so that the median axes 45a and 46a of the N doped zones and 34a of the P doped zone are suitably disposed with respect to the three studs 40, 42-43-41,44 of oxide junctions.

DESCRIPTION OF THE PREFERRED EMBODIMENT OF THE INVENTION

The invention starts from the established fact of the problem of accuracy in this vertical diffusion method of manufacturing an MOS component.

In FIG. 5, a first step of the procedure for manufacturing an integrated circuit in accordance with the invention has been shown. One embodiment having three layers is shown. Other embodiments, not described, have been constructed with five or seven layers.

Layer 50 is a silicon substrate. A second layer 51, formed by thermal growth for oxidizing layer 50 or by a deposit of LPCVD type, is made from silicon oxide. This layer is intended to form the oxide separating the polysilicon from contact with the substrate. A third polysilicon layer 52 is then deposited and doped.

Then, a triple layer 53 is provided for creating studs protecting the polysilicon layer 53. This layer 53 will be progressively consumed during the manufacturing process. It allows the accuracy of the first masking to be transferred to all the following direct maskings or etchings, thus avoiding the alignment problems inherent in micronic and submicronic etching.

A resin layer 54 is applied, a mask 55 and sunken exposure allow windows to be created for etching the protective layer 53.

In FIG. 6, a second step in the method of the invention has been shown. From FIG. 5, a window 60 has been created through the thickness of the protective layer 53 as far as the polysilicon of layer 52. The protection layer 53, in the application of the invention to the manufacture of an IGFET, includes three sublayers 63 and 65 of silicon oxide $SiO_2$ and 64 of silicon nitride $Si_3N_4$.

Now, the condition for etching the oxide and polysilicon are sufficiently remote from each other for the oxide to be a mask for etching of the polysilicon. In addition, the oxide plays the same role for the silicon nitride. Another important feature is used by the invention: nitride $Si_3N_4$ oxidizes about 10 times slower than the silicon for the same oxidation conditions. The conjunction of these two physico-chemical characteristics allows the implementation of the invention, namely the creation of successive self aligned windows in a method of manufacturing an integrated multilayer circuit. A man skilled in the art can adapt the above mentioned properties to other triads such as $((Si)_n, Si_3N_4, SiO_2)$ described hereafter.

In FIG. 6, a resin layer 66, 67 was then deposited and a second photolithographic mask 68 applied. This mask is placed above the window 60 obtained between two protective studs 61, 62. It can thus be seen that the protective studs allow the second mask not to be centered with a very high accuracy with respect to window 60 and so with the first mask.

In FIG. 7, chemical etching of the polysilicon of layer 52 has been carried out. The resin and the triple layer 53 have to protect the polysilicon outside the etching window 60 of FIG. 6. Then the resin zones are removed. Then chemical etching of the oxide of layer 51 is carried out in window 70 and of the layers 53 of the protective studs 61, 62 of FIG. 6. In FIG. 7, the protective studs 71 and 72 are now formed only by nitride 73 and lower oxide 74 layers. On the other side of each stud 71 or 72 with respect to window 70; the polysilicon 76 and 77 protects the buried oxide layer 78 or 79.

Then impurities of a first type are diffused in the substrate Si of layer 50, the polysilicon (76 and 77) serving as mask for this diffusion. A first doped zone 80 is formed, of a high concentration in the embodiment of an IG-FET.

In FIG. 8, a fourth step of the method of the invention has been shown. Controlled oxidization of the polysilicon layer 76 or 77 of FIG. 7 and of the silicon of layer 50 is carried out through window 70.

Since the source stud 88 is taken from the doped zone 80, the impurities are directed downwards away of thermal redistribution. Furthermore, the thermal growth of the oxide transforms the geometry of the external zones of the polysilicon layer by increasing the total height of the stack of layers outside the protective studs 89 and by penetrating at this position into the polysilicon layers 83. Finally, the nitride layers 86 and 87 are in particular oxidized at a speed reduced to a tenth of that of the polysilicon layers, which allows a man skilled in the art to calculate the initial respective heights of each layer as a function of the final desired height of each layer.

In FIG. 9, the last step in the manufacturing method of the invention is shown. Successively the following operations are carried out:

general etching of the upper oxide which causes layer 89 of the protective stud to disappear; it will be noted that the oxide layers 84, 85 and 88 are simultaneously reduced, etching of the nitride layer 86, 87, then uncovered; since the conditions for etching nitride and oxide are different, the oxide is not attacked and largely protects the silicon layers 50 and 83, so the doped zone 80, a new oxide etching of the following oxide sublayer which protected the polysilicon 83 during etching of the nitride; as for the preceding etching, the oxide contact studs are further reduced, polysilicon etching at the level of the protective studs (elsewhere the silicon and the polysilicon are protected by oxide).

Thus two self centered windows 95, 96 are obtained on the main doped zone, whose dimensions are guaranteed by those of the initial protective studs. These two windows separate contact studs 91, 92 (oxide+poly), gate stud 90, source (oxide) stud and gate studs 92, 94 (oxide+poly).

Through these windows, impurities of the first type (P for example) are first of all diffused in zones 97, 98 inside the first zone 101 of the same type. The doping, for an IGFET, will be carried out at a lower concentration. Then impurities of the second type (N in the example shown) are carried out in zones 99, 100 inside zones 97, 98.

It only remains to form the metallizations for the contacts and the conventional finishing operations.

It will be noted here that the final diffusions were carried out through a continuous oxide layer which culminates in the gate stud 90 of the IG-FET. A redistribution of the impurities is necessary by means of an annealing operation. In another embodiment, further etching of the upper oxide is carried out so as to completely free the windows 95, 96 of their oxide. The heights of the three oxide studs 90–92 are calculated accordingly.

The advantages of the invention are numerous. They will be illustrated within the field of discrete components, power components or not. The operation of a VD-MOS is analysed by its resistance Rb in transferring carriers into the parasite transistor which it presents. This value is responsible:

for parasite $\frac{d\,V_{DS}}{dt}$ triggering for parasite thyristor triggering, in the case of a BIP-MOS structure; in fact, this structure which uses a pair of complementary bipolar transistors, creates a parasite bipolar thyristor whose triggering current varies with Rb; the parasite thyristor may be triggered when the current flows under the highly doped N+ source (zone 99 for example) towards the P− doped contact zone (zone 97).

The second type of triggering may be readily pushed back by reducing the length of the N+ source zones (99 and 100). But, in high integration technologies, or others where the source length is already small, it becomes difficult to maintain control of this dimensional parameter.

As a general rule, it is desirable to reduce the resistance Rb. The P type impurity doping must be increased (more generally of the first type in the terminology of the description) in the zone considered. That leads to modifying the parameters of the channel and we are naturally led to extend the high concentration P zone 101 (first type doping) as far as the edges of the polysilicon layer, that is to say under the two windows 95 and 96. But this limit should not be exceeded so as not to penalize the threshold voltage of the MOS. It must then be guaranteed that the heavily doped zone 101 will be:

centered relatively to the gate stud, limited geometrically by the ends of the windows 95, 96.

Now, this is impossible to guarantee by superimposing several masks as in the prior art methods, where the cumulated alignment errors result in an error of 1 to 2 microns in the primary window 24 of FIG. 2 of the prior art.

Another advantage of the invention applied to VD-MOS technologies is to guarantee with high precision that the parasite reverse current be constant for a series of components having followed the same procedure.

Another advantage of the invention is to economize a photomasking step including the operations:

resin deposition,
exposure
resin removal.

Finally, the invention allows the sizes of the cell to be reduced by freeing itself from the tolerances due to alignment errors. In one embodiment, with identical manufacturing apparatus, it was possible to pass from cells of 22 microns to cells of 18 microns, which represents a saving of occupation on the silicon of 25%.

The invention has been described in the case of a VD-MOS transistor. It applies to cells of all technologies where lithographic masks are replaceable by protective studs which are consumable during the manufacturing procedure.

What is claimed is:

1. A method of manufacturing the source region of a vertical DMOS component, comprising the steps of:
   (a) successively depositing a first oxide layer, a nitride layer and a second oxide layer of predetermined thickness, on a substrate covered with a gate oxide layer and an intermediate polysilicon layer;
   (b) etching away according to a mask pattern, said first oxide layer, said nitride layer, and said second oxide layer so as to let in place two protective studs the interval between said studs corresponding to a first zone to be doped according to a first conductivity type and the position of said studs corresponding to two windows over second zones to be doped successively of the first and second conductivity types;
   (c) removing said polysilicon layer inside said studs;
   (d) etching any portion of the oxide layer in said window;
   (e) doping of a first high concentration type the first zone to be doped;
   (f) oxidizing the structure whereby the protective studs are much less oxidized than the rest;
   (g) partially removing the oxide layer formed during step d) and etching away the studs and the underlying portion of said polysilicon layer, thus defined by said windows; and
   (h) doping successively of a first and a second type silicon zones accessible through said windows, freed by disappearance of the studs.

2. The method as claimed in claim 1, including the opening of a window by masking wider than the access to the first zone to be doped.

* * * * *